(12) United States Patent
Kim et al.

(10) Patent No.: US 7,187,221 B2
(45) Date of Patent: Mar. 6, 2007

(54) DIGITAL DUTY CYCLE CORRECTOR

(75) Inventors: Joonho Kim, Cary, NC (US); Jung Pill Kim, Cary, NC (US); Alessandro Minzoni, Morrisville, NC (US)

(73) Assignee: Infineon Technologies AG, Munich (DE)

( * ) Notice: Subject to any disclaimer, the term of this patent is extended or adjusted under 35 U.S.C. 154(b) by 115 days.

(21) Appl. No.: 10/881,598

(22) Filed: Jun. 30, 2004

(65) Prior Publication Data

US 2006/0001462 A1 Jan. 5, 2006

(51) Int. Cl.
H03K 3/017 (2006.01)
H03L 7/06 (2006.01)

(52) U.S. Cl. .................... 327/175; 327/172; 327/158; 327/149; 327/144

(58) Field of Classification Search ........ 327/172–175, 327/158, 149, 144
See application file for complete search history.

(56) References Cited

U.S. PATENT DOCUMENTS

| 5,572,158 A * | 11/1996 | Lee et al. ............... 327/175 |
| 5,757,218 A * | 5/1998 | Blum .................... 327/175 |
| 6,069,511 A | 5/2000 | Mohan |
| 6,169,434 B1 | 1/2001 | Portmann |
| 6,212,126 B1 * | 4/2001 | Sakamoto ............... 365/233 |
| 6,411,145 B1 * | 6/2002 | Kueng et al. ............ 327/175 |
| 6,466,071 B2 | 10/2002 | Kim et al. |
| 6,489,821 B1 | 12/2002 | Kurd et al. |
| 6,501,313 B2 | 12/2002 | Boerstler et al. |
| 6,643,790 B1 | 11/2003 | Yu et al. |
| 6,690,202 B1 | 2/2004 | Groen et al. |
| 6,933,759 B1 * | 8/2005 | Wu et al. ............... 327/172 |
| 6,934,215 B2 * | 8/2005 | Chung et al. ........... 365/233 |
| 6,956,418 B2 * | 10/2005 | Kwak et al. ............ 327/158 |
| 6,959,062 B1 * | 10/2005 | Stubbs .................. 375/376 |
| 7,046,059 B2 * | 5/2006 | Kwak .................... 327/158 |
| 7,057,431 B2 * | 6/2006 | Kwak .................... 327/158 |
| 2003/0128061 A1 | 7/2003 | Heyne |
| 2004/0095174 A1 * | 5/2004 | Hong et al. ............. 327/175 |
| 2005/0093600 A1 * | 5/2005 | Kwak .................... 327/161 |

* cited by examiner

*Primary Examiner*—Dinh T. Le
(74) *Attorney, Agent, or Firm*—Slater & Matsil, L.L.P.

(57) ABSTRACT

A method for adjusting the relative phases of two signals includes receiving first and second signals, which may, for example, be derived from a differential clock signal. A duty cycle error between the first signal and the second signal is detected by comparing a phase component of the first signal with a phase component of the second signal. This duty cycle error can then be corrected by delaying the second signal by an amount based upon a result derived from the comparing.

28 Claims, 8 Drawing Sheets

DIGITAL DUTY CYCLE CORRECTOR

TECHNICAL FIELD

The present invention relates generally to electronic circuits, and more particularly to a system and method for a digital duty cycle corrector.

BACKGROUND

Semiconductors are generally used in integrated circuits for a wide range of electronic applications, including radios, televisions, cell phones, and personal computing devices, as examples. Over the years of development of integrated circuits, the structures used to form the integrated circuit elements such as transistors and diodes have been continually reduced in size to enable production of ever more complex devices in small sizes, with improved performance, and with low cost. An example of a highly integrated semiconductor device is a dynamic random access memory (DRAM) device in which a large number of transistors are configured to store a substantial amount of digital information in a very compact size with relatively low cost.

One type of DRAM is a double data rate (DDR) synchronous dynamic random access memory (SDRAM). Double data rate memories use a differential clock signal that is carried over two lines, where each line carries complement of the other line. Output data from the memory are aligned to the rising and falling edge of both clocks lines. Therefore, the duty cycle of the differential clock directly affects the output data window.

FIG. 1 shows a timing diagram of the output data window as compared with the differential clock. As noted in the figure, the differential clock includes two complementary components, labeled CLK and bCLK (sometimes called "clock bar"). The output data is labeled DATA_OUT. The chart shows three time periods: tCK is the cycle time of CLK and bCLK; tDT is the time from the rising edge of CLK to the rising edge of bCLK; and tbDT is the time from the rising edge of bCLK to the rising edge of CLK. From these time periods, two duty cycles can be computed. In particular, the duty cycle of CLK can be computed as tDT/tCK and the duty cycle of bCLK can be computed as tbDT/tCK.

The duty cycle of the differential clock that includes CLK and bCLK is critical to the setup/hold time of the device receiving the data. In general, while it is desirable to have a 50% duty cycle, the differential clock provided to a DRAM can have some range of duty cycle distortion for the data interface. As the clock frequency becomes higher (i.e., as tCK becomes smaller), the duty cycle distortion becomes more critical. Consequently, a high-end memory device includes an on-chip duty cycle corrector (DCC).

A number of analog DCCs have been developed for fast operating chips such as microprocessors and graphics memories. An analog DCC, however, is not suitable for commodity memory chips since it is very difficult to save power consumption during the power saving mode. In general, an analog DCC uses the difference of accumulated charges between the two clock lines. Unfortunately, it is very difficult to keep the accumulated charges for a long time without updating. Therefore, even if a memory chip is in a power saving mode, the clock should be provided to the DCC in order to keep the accumulated charges. This means that neither the clock buffers nor the DCC can be disabled during the power saving mode. Consequently, the chip continuously consumes power even during the power saving mode.

SUMMARY OF THE INVENTION

These and other problems are generally solved or circumvented, and technical advantages are generally achieved, by preferred embodiments of the present invention, which provides a digital duty cycle corrector. The preferred embodiment of this invention uses digital circuits to compare and correct duty cycles of two clocks (e.g., derived from components of a differential clock). Digital information to correct duty cycle distortion is stored in a register. As a result, the clocks are not needed during power saving modes. Consequently, the power consumption of the chip can be reduced.

In accordance with a preferred embodiment of the present invention, a method for adjusting the relative phases of two signals includes receiving first and second signals, which may, for example, be derived from a differential clock signal. A duty cycle error between the first signal and the second signal is detected by comparing a phase component of the first signal with a phase component of the second signal. This duty cycle error can then be corrected by delaying the second signal by an amount based upon a result derived from the comparing.

In accordance with another preferred embodiment of the present invention, the second signal is a complement of the first signal. Delaying the first signal by a first amount of delay creates a delayed version of the first signal. The first amount of delay is determined so that an edge of the delayed version of the first signal is aligned to an edge of the second signal. Delaying the second signal by the first amount of delay can also create a delayed version of the second signal. A duty cycle of the first and second signals can be adjusted by delaying the second signal by a second amount of delay. To adjust the duty cycle to about 50%, the change in the second amount of delay should be equal to about half of the change in the first amount of delay.

Embodiments of the present invention can be implemented using a circuit that includes four delay elements. The third delay element has an input coupled to the output of the first delay element and the fourth delay element has an input coupled to the output of the second delay element. A first phase detector has a first input coupled to the output of the second delay element and a second input coupled to the output of the third delay element. Similarly, a second phase detector has a first input coupled to the output of the first delay element and a second input coupled to the output of the fourth delay element. A finite state machine has inputs coupled to the outputs of the first and second phase detectors and outputs coupled to control inputs of the delay elements.

An advantage of a preferred embodiment of the present invention is that power consumption can be reduced. As noted above, it is very difficult to save power consumption during the power saving mode when an analog duty cycle corrector is used, which might generate 3–4 mA of current in the power saving mode. This problem, however, can be solved using a digital duty cycle corrector as proposed here. The digital duty cycle corrector can store the duty cycle information during power savings mode and could consume no current during power down mode.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a differential clock of a double data rate (DDR) synchronous dynamic random access memory (DRAM). The invention may also be applied, however, to other systems that include complementary signals (either clocks or other signals) that desire to have the edge of one signal spaced a predetermined amount from the edge of the other signal. Examples include other memory devices as well as logic chips such as processors and communications chips.

Figure 1:
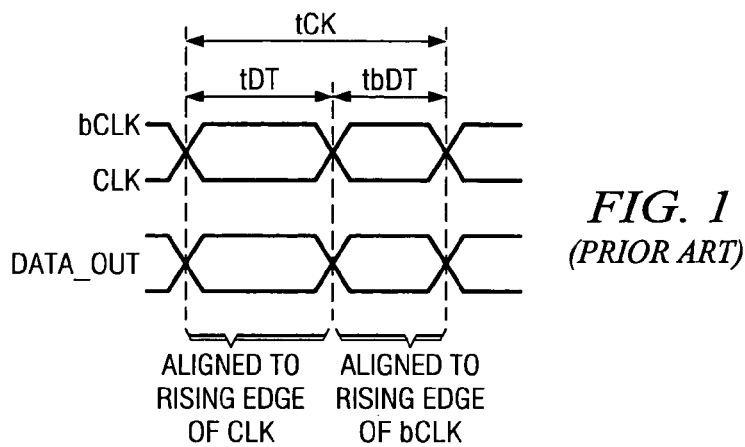
FIG. 1 is a timing diagram illustrating output data windows for complementary clock signals having duty cycle distortion.
Figure 2:
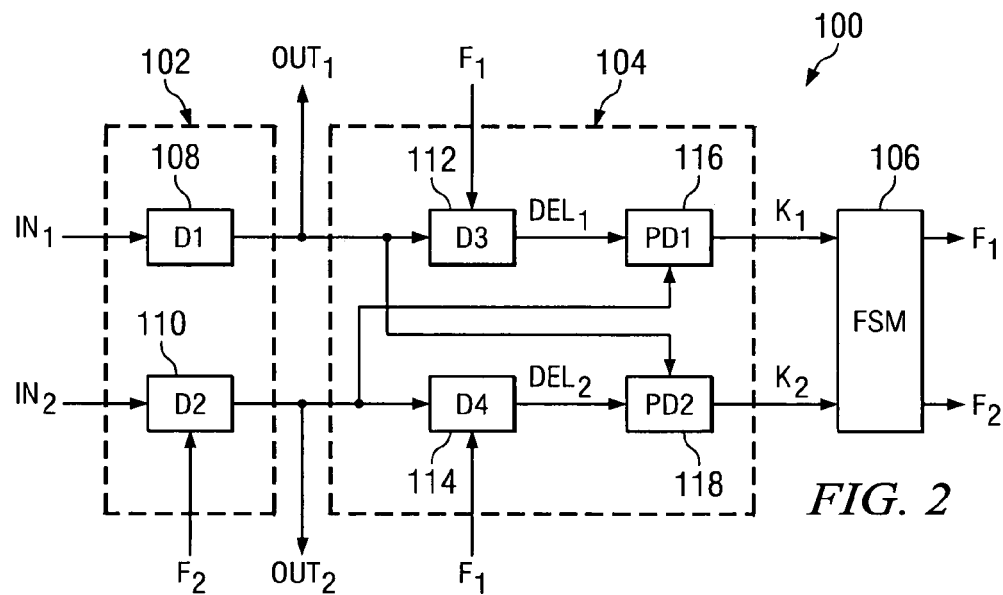
FIG. 2 is a block diagram of a preferred embodiment of the invention.

FIG. 2 shows a block diagram of a preferred embodiment circuit 100, which can serve as a digital duty cycle corrector. The illustrated embodiment includes three blocks, namely a duty cycle corrector 102, a duty cycle detector 104 and a finite state machine (FSM) 106. As will be discussed in greater detail below, the duty cycle detector 104 detects the duty cycle error and the duty cycle corrector 102 corrects the duty cycle error. In this example, the duty cycle is corrected when one or both of the edges (rising or falling) of the signal $OUT_1$ have a predetermined phase relationship with the corresponding edge of the signal $OUT_2$. For example, in the preferred embodiment, it is desirable that the corresponding edges be 180° out of phase from one another.

In the preferred embodiment, the input signals $IN_1$ and $IN_2$ are clock signals, preferably derived from a differential clock signal. Accordingly, the input signal $IN_1$ is the complement of the input signal $IN_2$ and vice versa (i.e., $IN_1 = \overline{IN_2}$ and $\overline{IN_1} = IN_2$). In the case of an SDRAM, the signal $IN_1$ can be a clock signal CLK and the signal $IN_2$ can be a clock signal bCLK. It is assumed that these signals experience duty cycle distortion, which the circuit 100 will correct.

The output signals $OUT_1$ and $OUT_2$ represent signals in which the duty cycle distortion has been removed. These signals are not typically complements of another. In the preferred embodiment, however, the time period between the rising (or falling edge) of the signal $OUT_1$ and the rising (or falling) edge of signal $OUT_2$ is the same as the time period between the rising (or falling edge) of the signal $OUT_2$ and the rising (or falling) edge of signal $OUT_1$. This relationship effectively replicates a pair of complementary signals with a 50% duty cycle.

The duty cycle corrector 102 includes a first delay element 108 and a second delay element 110. The first delay element 108 delays the input signal $IN_1$ by a fixed amount to create signal $OUT_1$. That is, preferably, delay element 108 is a fixed or non-variable delay. The second delay element 110 is operable to delay the input signal $IN_2$ by a variable amount in accordance with control signal F2. As will be explained in greater detail, the control signal F2 adjusts the amount of delay according to a result of the duty cycle comparison.

The duty cycle comparator 104 compares duty cycles of two signals $OUT_1$ and $OUT_2$. In the illustrated embodiment, this circuit includes delay elements 112 and 114 and phase detectors 116 and 118. The delay element 112 delays signal $OUT_1$ to create signal $DEL_1$ while the delay element 114 delays signal $OUT_2$ to create signal $DEL_2$. Preferably the delay elements 112 and 114 have the same amount of delay. This amount of delay can be varied by signal F1 according to the result of the phase detection.

The phase detector 116 compares the amplitudes of the signals $OUT_2$ and $DEL_1$ to provide an output signal K1 that indicates which of the two signals is greater. In this operation of this embodiment, the phase detector 116 serves to detect the phase of the signal $OUT_2$ with the rising (or falling) of signal $DEL_1$, with signal K1 changing states when the edge is detected. Phase detector 118 operates in a similar manner. In operation, this detector 118 detects the phase of signal $OUT_1$ with the rising edge of signal $DEL_2$ to output signal K2. Accordingly, signal K1 indicates the phase of signal $OUT_2$ as detected by signal $DEL_1$ and signal K2 indicates the phase of signal $OUT_1$ as detected by signal $DEL_2$.

The finite state machine 106 generates control signals F1 and F2 to adjust the amount of delay of the variable delay elements 110, 112 and 114. A combination of the signal K1 being high and the signal K2 being low indicates that the duty cycle of signal $OUT_1$ is smaller than that of signal $OUT_2$. In this case the finite state machine 106 causes the signal F2 to increase the amount of delay of element 110 (D2). If signal K1 is low and signal K2 is high, the duty cycle of signal $OUT_1$ is larger than that of signal $OUT_2$. In this case, the finite state machine 106 causes signal F2 to decrease the amount of the delay of delay element 110 (D2). If both signals K1 and K2 are low, the finite state machine 106 causes signal F1 to increase the amount of delay of elements 112 and 114 (D3 and D4) while if both signals K1 and K2 are high, the finite state machine 106 causes signal F1 to decrease the amount of delay of elements 112 and 114 (D3 and D4). Table 1 shows the functional definitions of F1 and F2.

TABLE 1

| K1 | K2 | F1 | F2 |
|----|----|----|----|
| 0  | 0  | +  | 0  |
| 0  | 1  | 0  | −  |
| 1  | 0  | 0  | +  |
| 1  | 1  | −  | 0  |

The operation of the preferred embodiment circuit can be better understood by reference to a number of examples. In particular, FIGS. 3a–3b and 4a–4h illustrate a first case when the duty cycle of signal $IN_1$ is less than the duty cycle of signal $IN_2$. FIGS. 5a–5b and 6a–6h illustrate a second case when the duty cycle of signal $IN_1$ is greater than the duty cycle of signal $IN_2$. These examples are labeled for the situation where the signals are clock signals, such as those that would be used in a DDR SDRAM. The relationship between the signals shown in FIG. 2 and the signals shown in FIGS. 3–8 is shown in Table 2.

TABLE 2

| Block Diagram Label | Timing Chart Label |
|---|---|
| $IN_1$ | CLK_IN |
| $IN_2$ | bCLK_IN |
| $OUT_1$ | CLK_OUT |
| $OUT_2$ | bCLK_OUT |
| $DEL_1$ | DCLK |
| $DEL_2$ | bDCLK |

Figure 3A:
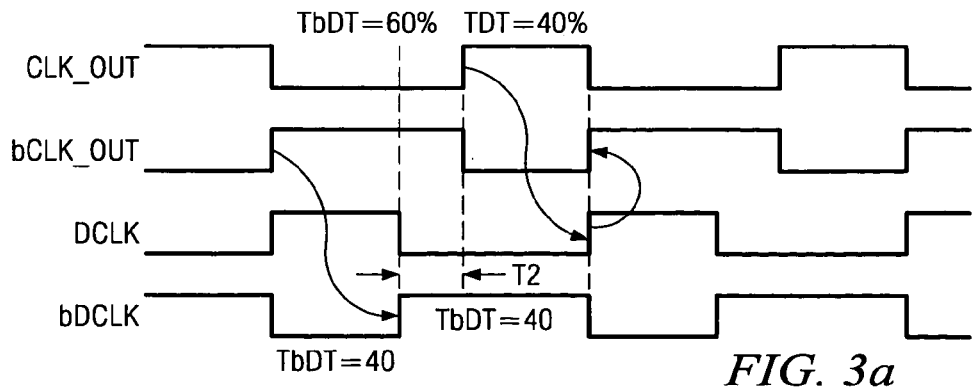
FIGS. 3a–3b are diagrams illustrating operation of an embodiment of the invention.
Figure 3B:
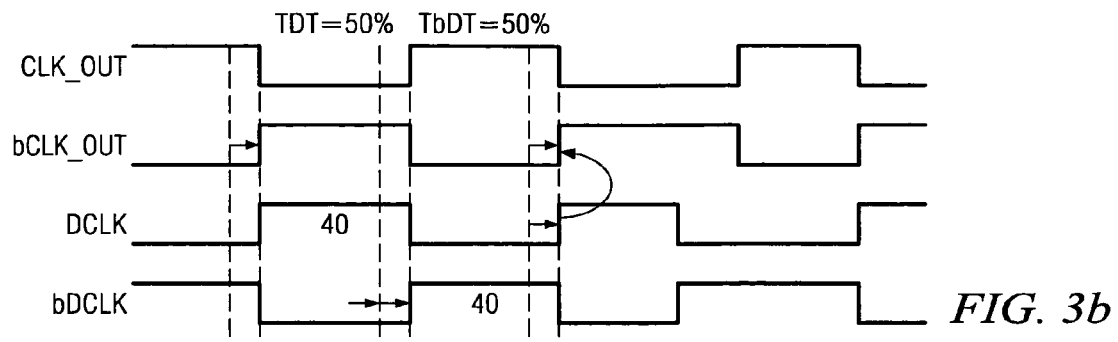

FIGS. 3a and 3b demonstrate the operation when the duty cycle of signal CLK_IN is less than the duty cycle of signal bCLK_IN. In the first step, illustrated in FIG. 3a, the rising edge of the signal DCLK is aligned to the rising edge of signal bCLK_OUT. When these edges are aligned, the time between the rising edge of signal bCLK_OUT and the rising edge of signal DCLK with become T2, which is equal to twice of the correction time Tcorr. In the second step, illustrated in FIG. 3b, the rising edge of signal bCLK_OUT is adjusted to the center of time period T2. Once this occurs, the desired relationship between the signals CLK_OUT and bCLK_OUT is achieved.

The operation of the second step can be summarized as follows:
1) Increase delay of bCLK_OUT as much as Tcorr=T2/2
2) Then, bDCLK also increases as much as Tcorr=T2/2
3) DCLK and bDCLK will be increased as much as Tcorr according to the steps of FIG. 3a. Then the rising edge of DCLK is aligned to the rising edge of bCLK_OUT.
4) Now, the duty cycle is corrected.

The operation of the first case can best be understood with reference to a specific example. This example is provided in the timing charts of FIGS. 4a–4h and the seven steps listed below.

Step 1) Repeatedly assert F1_PLUS
Step 2) Assert F2_PLUS (rising edge of DCLK is aligned to rising edge of bCLK_OUT)
Step 3) Assert F1_PLUS
Step 4) Repeat Step 2) and Step 3)
Step 5) Assert F1_MINUS (rising edge of bDCLK is aligned to rising edge of CLK_OUT)
Step 6) Assert F1_PLUS
Step 7) Repeat Step 5) and Step 6)

Figure 4A:
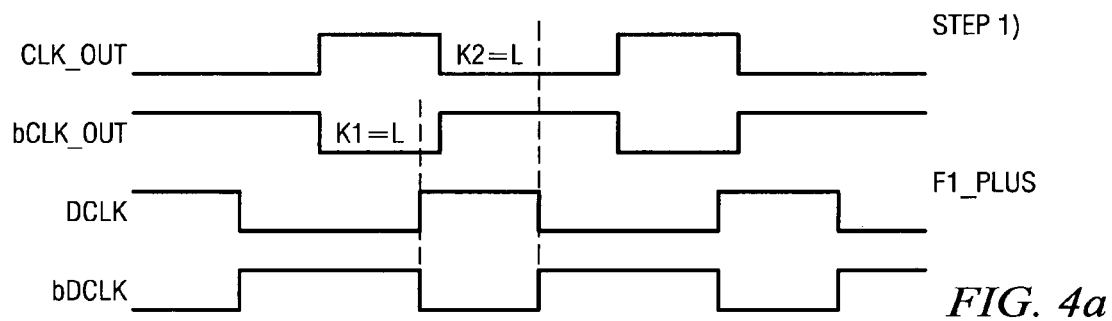
FIGS. 4a–4h are timing diagrams showing steps in the operation of FIGS. 3a–3b.
Figure 4B:
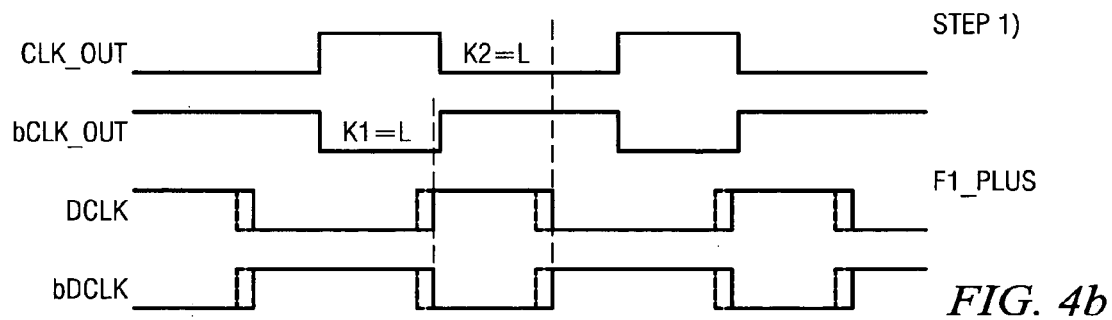

Referring now to FIG. 4a, the signal K1 is low ("0") indicating that bCLK_OUT is low at the rising edge of DCLK and the signal K2 is also low ("0") indicating that CLK_OUT is low at the rising edge of bDCLK. As a result, the signal F1_PLUS is asserted, which causes the delay of elements 112 and 114 (D3 and D4) to be increased. As shown in FIG. 4b, assertion of signal F1_PLUS causes signals DCLK and bDCLK to be delayed further, illustrated as being shifted to the right in the chart (where the dashed lines correspond to the timing of the edges at the time of FIG. 4a). This procedure is repeated until either K1 or K2 goes high. (In this case, K1 goes high first since the duty cycle of CLK_IN is less than the duty cycle of bCLK_IN. FIG. 5 illustrates the other case).

Figure 4C:
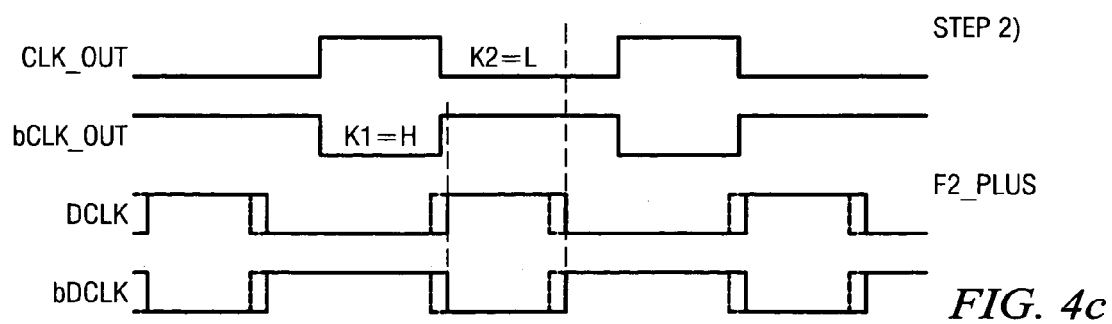
Figure 4D:
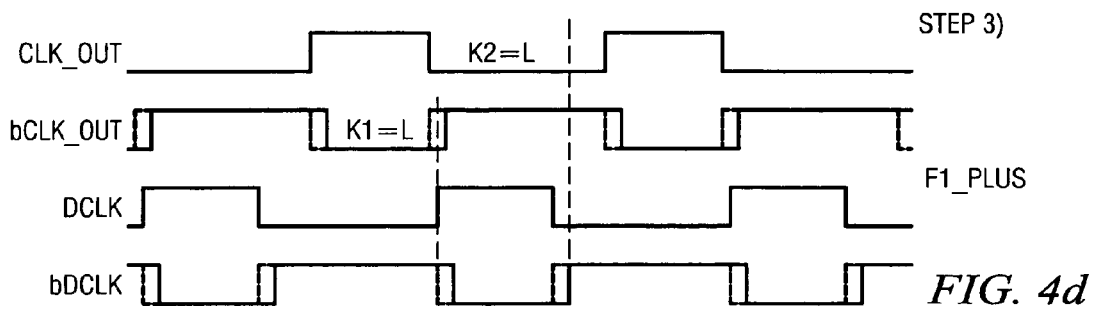
Figure 4E:
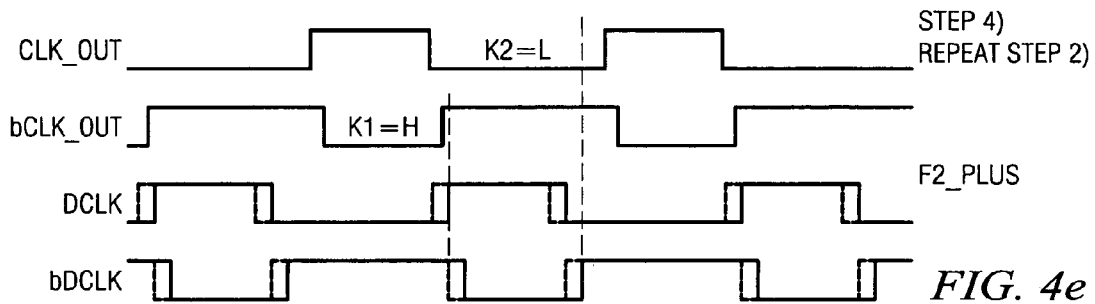
Figure 4F:
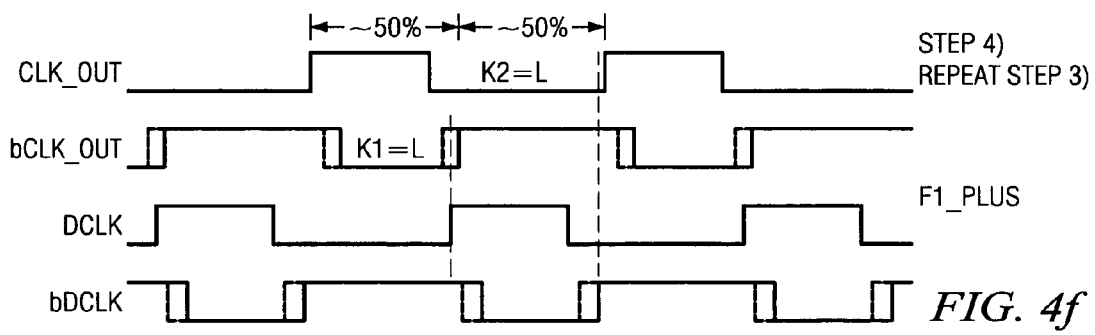

FIG. 4c shows the time when signal DCLK has been delayed (time shifted) so that the rising edge of DCK is aligned to the rising edge of bCLK_OUT (to within the accuracy of the incremental delay units of the delay elements 112 and 114). At this point, the signal F2_PLUS is activated causing the signal bCLK_OUT to be delayed (time shifted to the right). As illustrated in FIG. 4c, delaying bCLK_OUT will cause signal K1 to go low again. As a result, signal F1_PLUS is activated to delay DCLK and bDCLK. As illustrated by FIGS. 4e and 4f, these steps are repeated, effectively moving signals bCLK_OUT, DCLK and bDCLK together to the right.

Figure 4G:
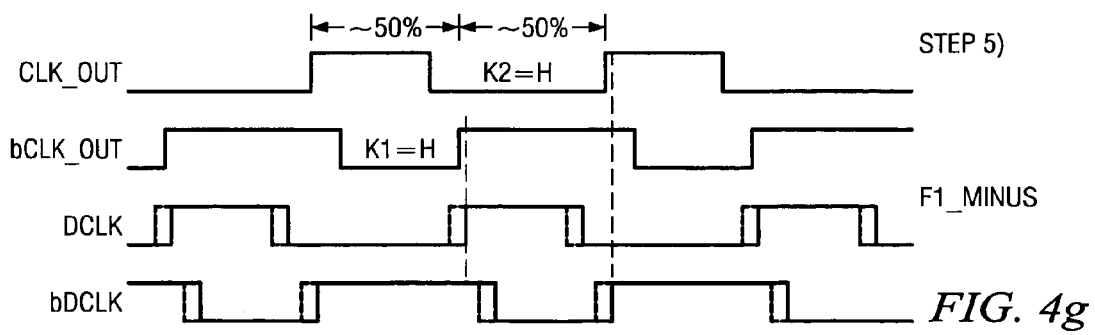

The repetition stops when the rising edge of signal bDCLK reaches the rising edge of signal CLK_OUT as shown in FIG. 4g. At this point, the goal has been reached. Namely, the time period between the rising edge of CLK_OUT and the rising edge of bCLK_OUT is one half of the total time period of the signals CLK_OUT and bCLK_OUT (as defined by the time period between a first rising edge of CKL_OUT or bCLK_OUT and a next subsequent rising edge of CLK_OUT or bCLK_OUT).

Figure 4H:
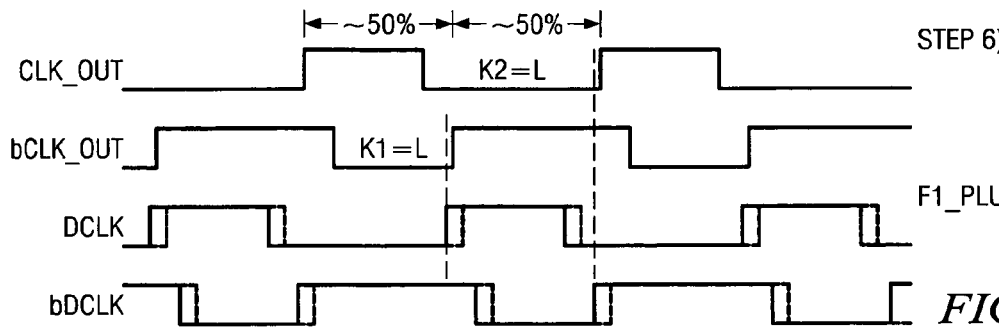

In step 6, shown in FIG. 4h, the signal F1_PLUS is asserted causing DCLK and bDCLK to be further delayed. As denoted by step 7 above, the signals F1_MINUS and F1_PLUS can be alternately asserted, effectively keeping the rising edge of bCLK_OUT aligned within one delay increment with the rising edge of DCLK.

Figure 5A:
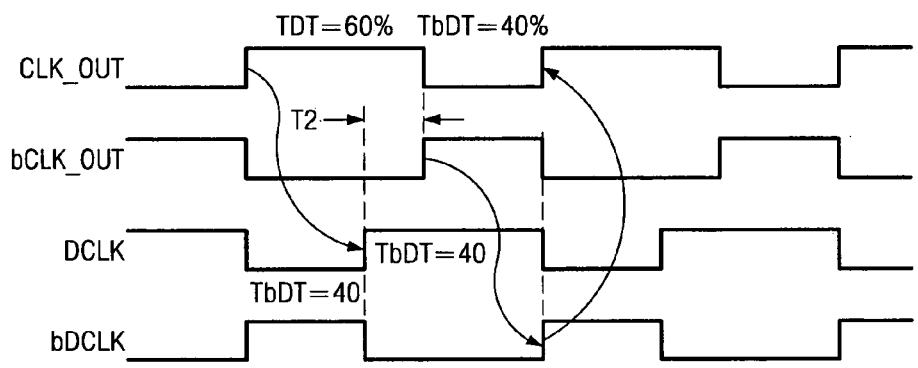
FIGS. 5a–5b are diagrams illustrating operation of an embodiment of the invention.
Figure 5B:
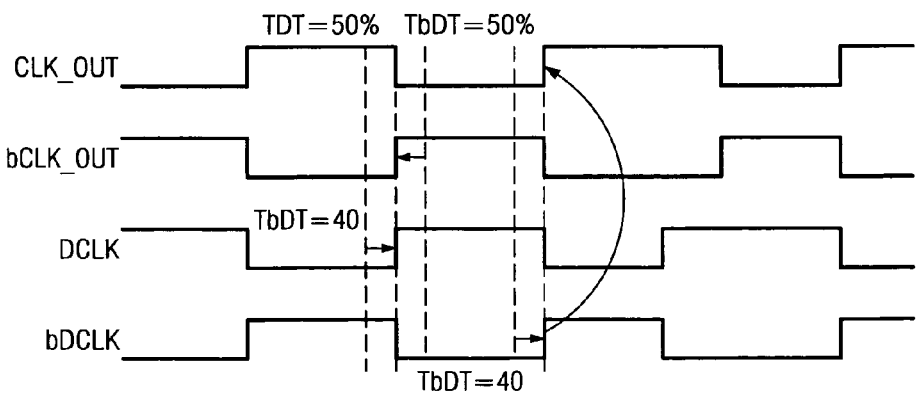
Figure 6A:
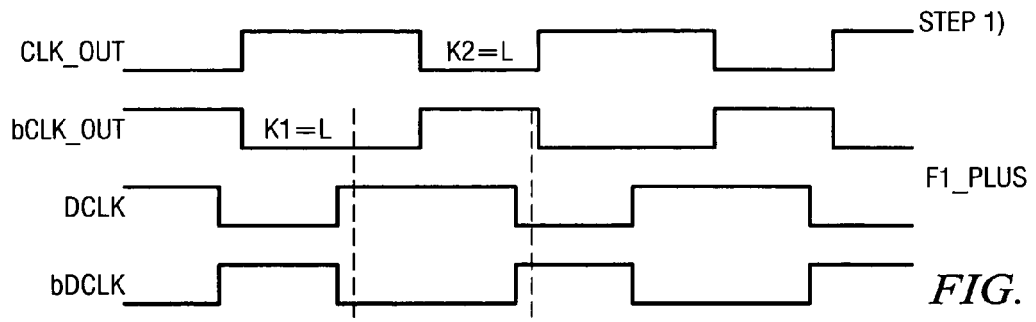
FIGS. 6a–6h are timing diagrams showing steps in the operation of FIGS. 5a–5b.
Figure 6B:
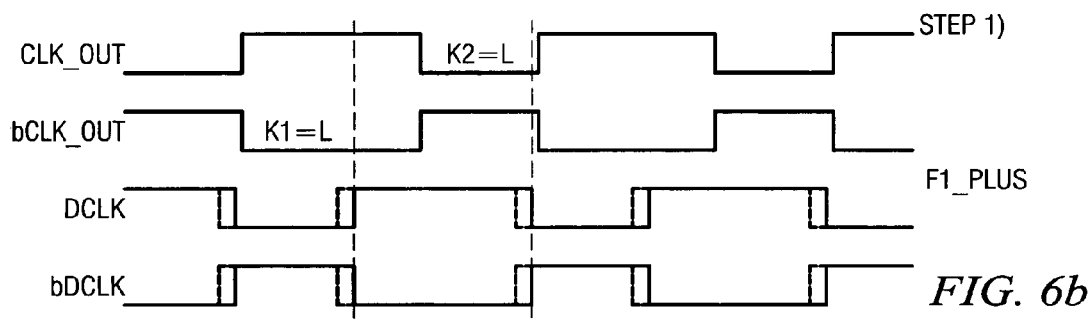
Figure 6C:
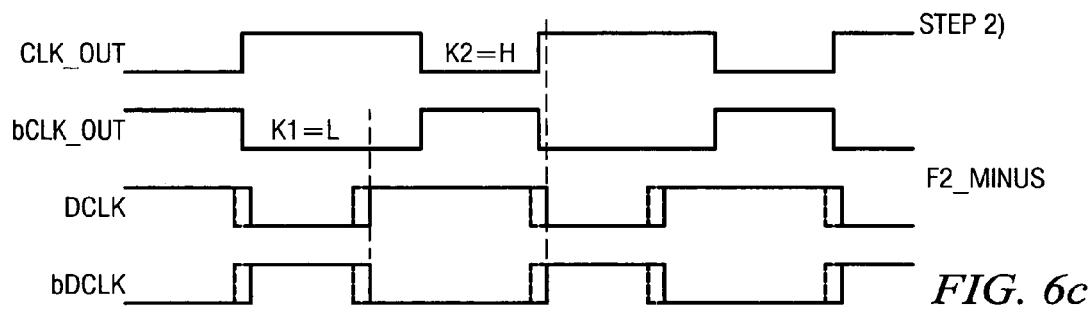
Figure 6D:
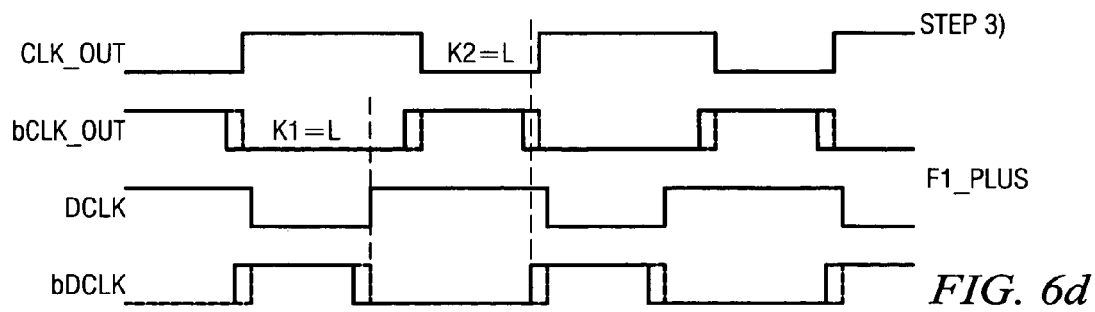
Figure 6E:
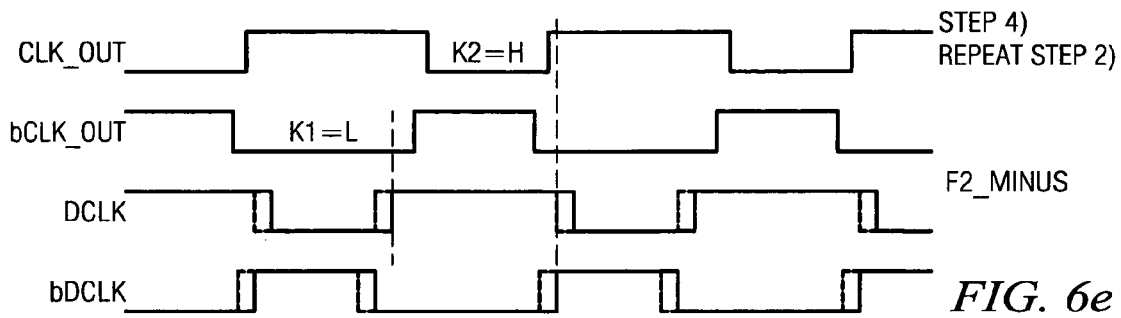
Figure 6F:
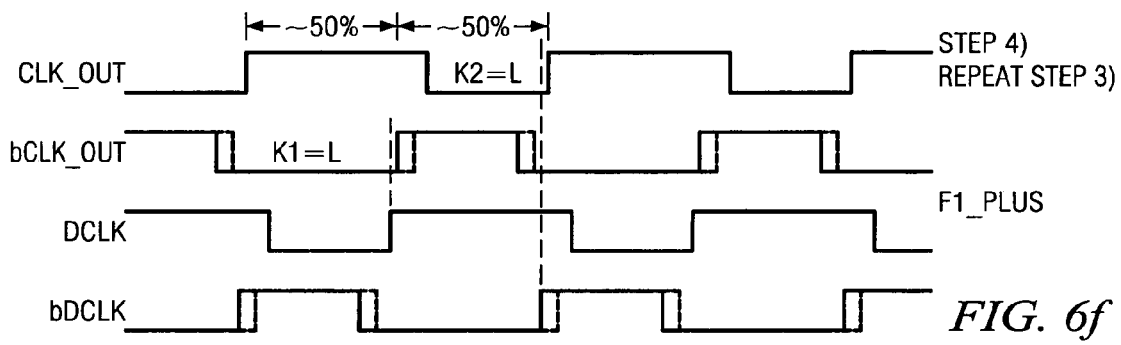
Figure 6G:
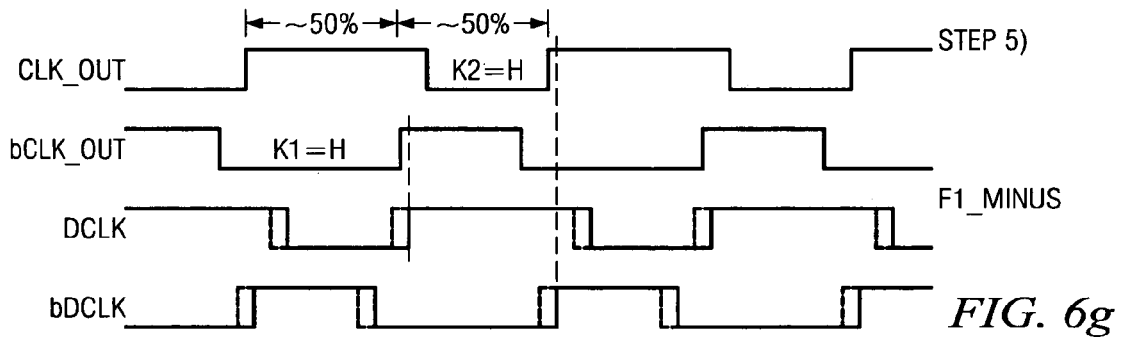
Figure 6H:
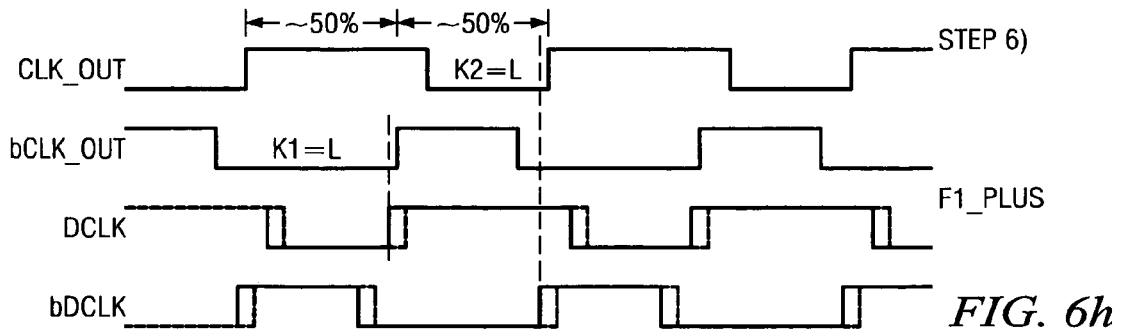

FIGS. 5a and 5b illustrate the second case, where the duty cycle of signal CLK_IN is greater than the duty cycle of signal bCLK_IN. In the first step, shown in FIG. 5a, the rising edge of signal bDCLK is aligned to the rising edge of signal CLK_OUT. At this point, the time between the rising edge of bCLK_OUT and the rising edge of DCLK is equal to time period T2, which is twice the correction time Tcorr.

As shown in FIG. 5b, the rising edge of signal bCLK_OUT can then be adjusted to the center of time period T2. Once this occurs, the desired relationship between the signals CLK_OUT and bCLK_OUT is achieved. The operation of the second step can be summarized as follows:
1) Decrease delay of bCLK_OUT as much as Tcorr=T2/2
2) Then, bDCLK also decreases as much as Tcorr=T2/2
3) DCLK and bDCLK will be increased as much as Tcorr according to the steps of FIG. 5a. Then the rising edge of DCLK is aligned to the rising edge of bCLK_OUT.
4) Now, the duty cycle is corrected.

FIGS. 6a–6h illustrate the operation of the second with reference to a specific example. The seven steps listed below describe the detailed changes in signal timing over time.

Step 1) Repeatedly assert F1_PLUS
Step 2) Assert F2_MINUS (rising edge of bDCLK is aligned to rising edge of CLK_OUT)
Step 3) Assert F1_PLUS
Step 4) Repeat Step 2) and Step 3)
Step 5) Assert F1_MINUS (rising edge of DCLK is aligned to rising edge of bCLK_OUT and the duty cycles are corrected)
Step 6) Assert F1_PLUS
Step 7) Repeat Step 5) and Step 6)

Due to the similarity between the examples of FIGS. 4 and 6, a detailed description will not be repeated.

The digital duty cycle detector 100 described herein is well suited to work in conjunction with a delay locked loop (DLL) 120. FIGS. 7–10 illustrate various embodiments where the digital DCC 100 is implemented with a DLL 120. In any of these embodiments, various types of DLLs can be used. One structure is shown for the purposes of illustration.

Figure 7:
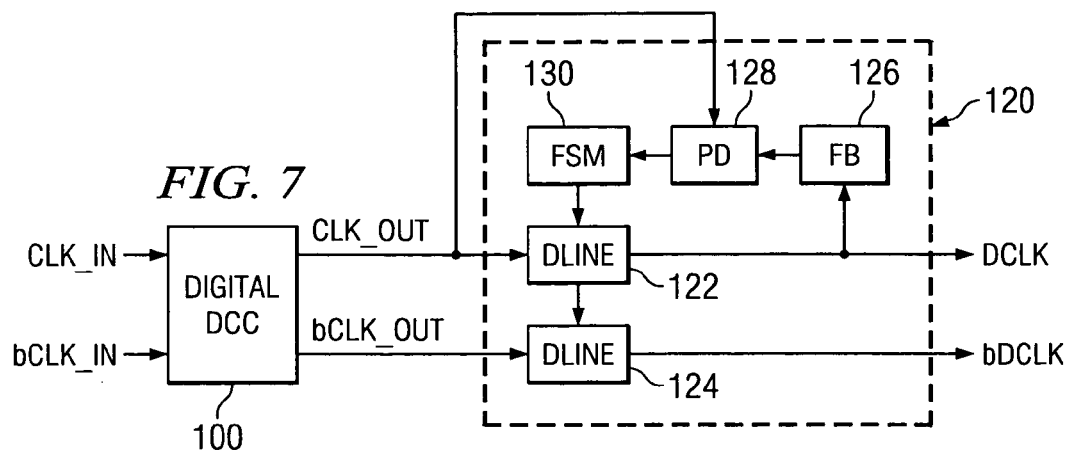
FIGS. 7–10 are various timing circuits of the present invention.

FIG. 7 shows an implementation where the digital DCC 100 is placed in front of the DLL 120. As shown, the input clock signals CLK_IN and bCLK_IN are provided to DCC 100 and the output clock signals CLK_OUT and bCLK- _OUT are provided from DCC 100 to DLL 120. The DCC 100 can be a duty cycle corrector as described above.

The DLL 120 includes a first delay line 122 coupled to receive the clock signal CLK_OUT and a second delay line 124 coupled to receive the clock signal bCLK_OUT. The output of the first delay line 122 is provided to a feedback element 126. The output of feedback element 126 is provided to a phase detector 128, which compares the phase of the signal from feedback element 126 with the signal CLK_OUT. The output of the phase detector 128 is provided to a finite state machine 130, which controls the delay of delay line 122 and delay line 124.

In the preferred embodiment, the delay locked loop 120 serves to align the signals DCLK and bDCLK with the signals CLK_IN and bCLK_IN. In a DDR SDRAM, data is intended to be output synchronously with the external differential clock, from which CLK_IN and bCLK_IN are derived. In practice, the data is actually output by the data clocks DCLK and bCLK. Therefore, if the data clocks are aligned with the external clock, the data will be output synchronously with the external clock. Since internal circuitry (e.g., buffers, conductive lines, etc.) add delay between CLK_IN (and bCLK_IN) and DCLK (and bDCLK_IN), the DLL 120 is used to effectively remove this delay.

Referring to FIG. 7, the clock signal CLK_OUT is applied to a programmable delay line 122. The output of delay 122 is applied to feedback element 126, which preferably comprises a delay element that simulates delays experienced by CLK_IN within the chip. Phase detector 128 compares the phase difference between the feedback clock signal (from FB 126) to the clock CLK_OUT and causes finite state machine 130 to generate a control signal that will adjust the delays of delay lines 122 and 124. Once the phase detector determines that no phase difference exists, the data clock will be synchronized as desired. This data clock DCLK and bDCLK can then be provided to off-chip drivers (not shown in FIG. 7; the off-chip drivers are located in block 164 of FIG. 11).

Figure 8:
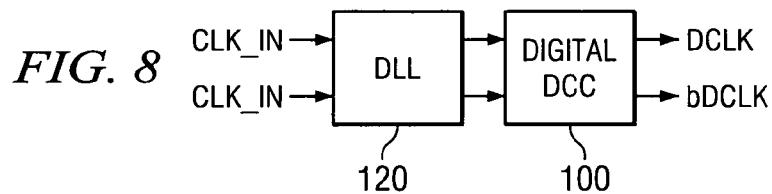

FIG. 8 describes an alternate configuration where the digital DCC 100 is placed at the output of the DLL 120. In this embodiment, the duty cycle of the aligned clock is corrected by digital DCC 100. Therefore, in this circuit, any duty cycle distortion created by the DLL 120 can be corrected.

Figure 9:
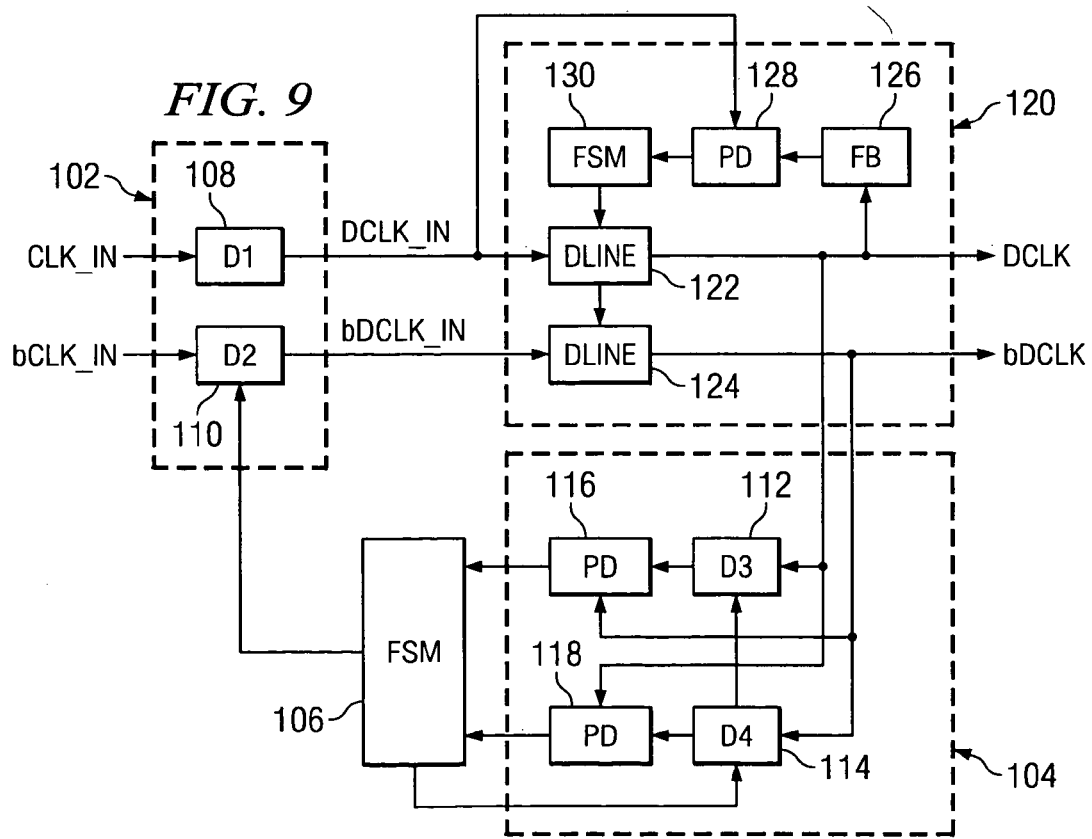

FIG. 9 shows an implementation where the DLL 120 is located between the duty cycle corrector 102 and the duty cycle detector 104. In this case, the outputs DCLK_IN and bDCLK_IN of the duty cycle corrector 102 are provided to DLL 120, which generates signals DCLK and bDCLK. These signals are provided to the duty cycle detector 104, which can be used to adjust the duty cycle of DCLK_IN and bDCLK_IN (and consequently the duty cycle of DCLK and bDCLK).

Figure 10:
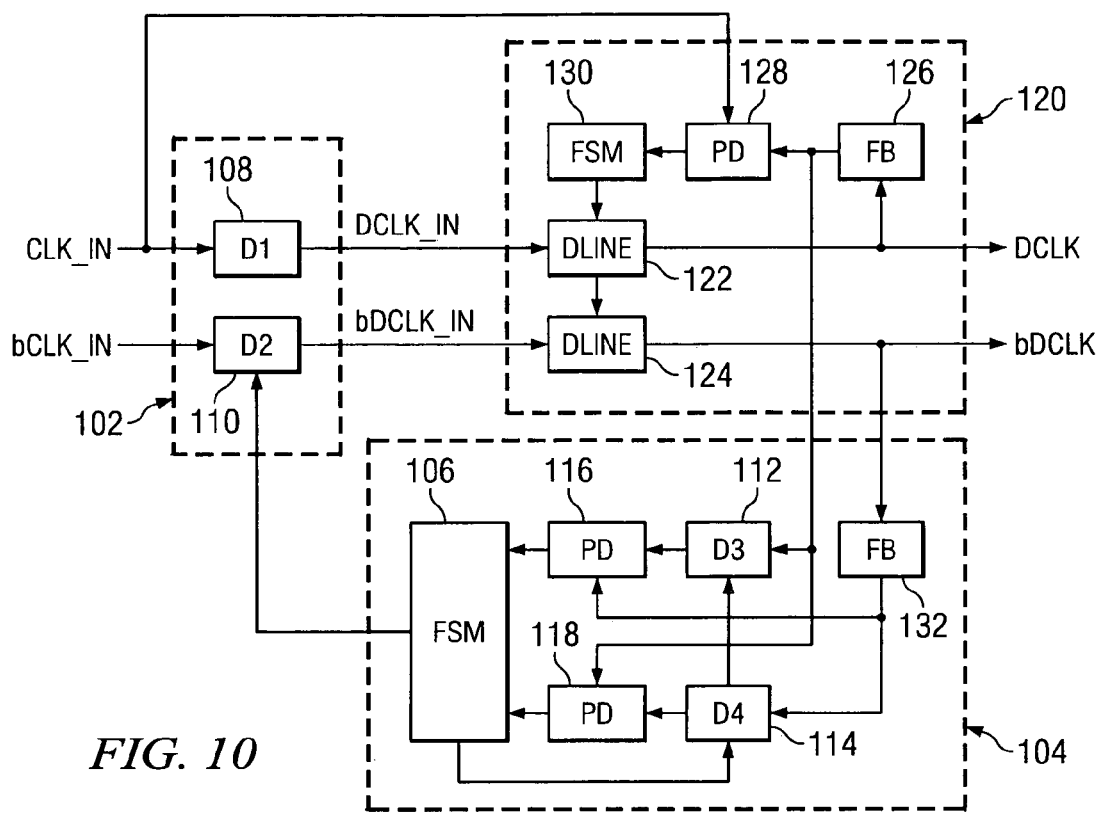

FIG. 10 shows another implementation where the DLL 120 is located between the duty cycle corrector 102 and the duty cycle detector 104. This case is similar to that of FIG. 9 except that a feedback element 132 is provided in the duty cycle detector 104. In this example, delay line 112 receives an input that has already been delayed by feedback element 126. To maintain symmetry, the feedback element 132, which preferably is identical element 126, is placed between the signal bDCLK and the delay element 114.

Figure 11:
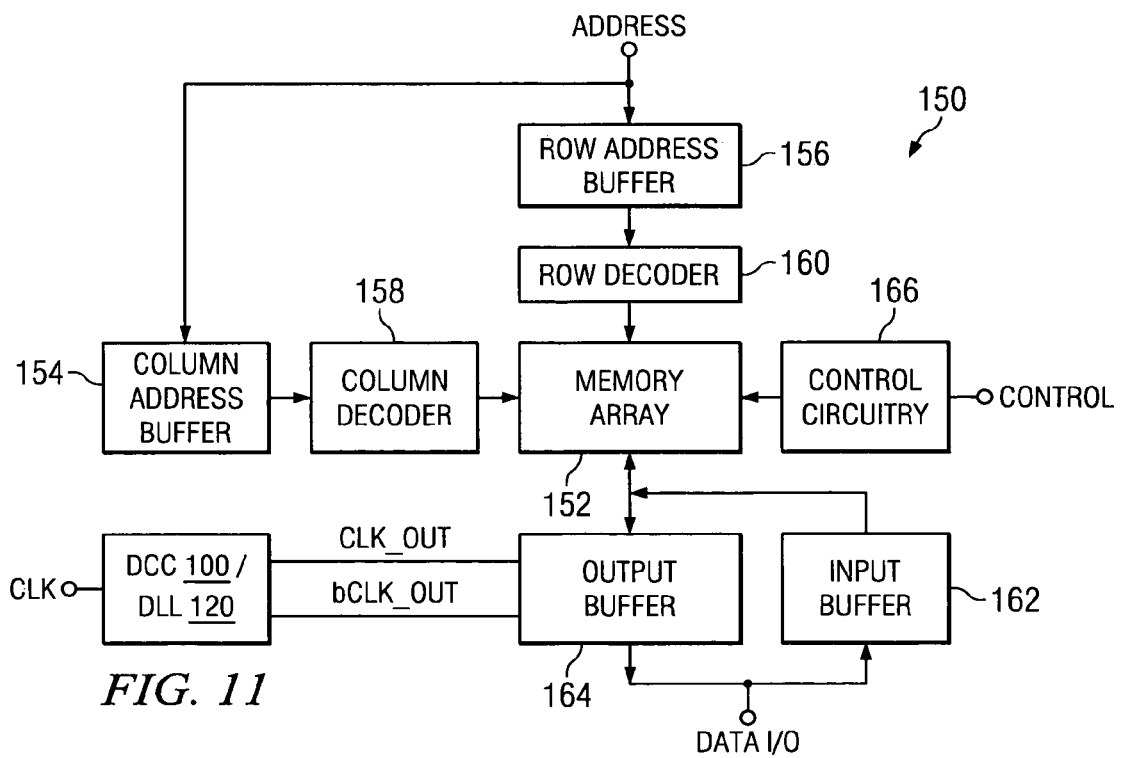
FIG. 11 is a simplified block diagram of a memory device that can utilize aspects of the present invention.

FIG. 11 provides a simplified block diagram of a memory device that can utilize aspects of the present invention. Preferably, all of the elements shown in FIG. 11 are formed on a single semiconductor substrate. An array 152 includes a number of memory cells arranged in rows and columns. For a DRAM, each memory cell includes a pass transistor coupled in series with a storage capacitor. The memory cells are coupled to a number of wordlines along each row and to a number of bitlines along each column. As is known in the art, the bitlines are arranged in complementary pairs.

To access a particular cell in the array 152, an address signal ADDR is transmitted to a column address buffer 154 and row address buffer 156. In a typical DRAM chip, the column address and row address share external pins so that the row address is received at a first time and the column address is received at a second time. The ADDR signals may be transmitted by an external device, such as a memory controller (not shown), for example.

The column address buffer 154 and row address buffer 156 are adapted to buffer the address signal. The outputs of the column address buffer 154 and row address buffer 156 are coupled to a column decoder 158 and row decoder 160, respectively. The column and row decoders 158 and 160 are adapted to decode the signals received from the column address buffer 154 and row address buffer 156, respectively, to provide the signal input to the array 152 such that the selected row and column can be selected.

In FIG. 11, the decoders 158 and 160 are shown as single blocks. It should be understood, however, that the decoders might carry out several levels of predecoding and decoding. Some, all, or none of these levels may be clocked.

Data that is addressed in memory 150 will be written into memory 152 or read from memory 152 via data input buffer 162 and data output buffer 164. A signal external input/output terminal I/O provides the pathway outside the chip. Once again, the drawing provides great simplification. The data buffers 162 and 164 and the associated line are provided to represent the read and write path, which may include a large number of lines and other components (e.g., secondary sense amplifiers). In the preferred embodiment, multiple bits (e.g., 4, 8 or 16) are input and output simultaneously. As a result, multiple data input buffers 162 and output buffers 164 will be included on the chip.

The figure shows that the output of the duty cycle corrector 100 (with or without the delay locked loop 120) is provided to tho output buffer 164. This connection is provided to be illustrative of many uses of the clock. Once again, the illustration is simplified and intervening elements, if any, are not shown. The output buffer is configured to output a bit of information on the rising edge of the clock signal CLK_OUT and another bit of information on the rising edge of clock signal bCLK_OUT (or DCLK and bDCLK if the timing circuits of FIGS. 7–10 are used). The external clock CLK, which is preferably a differential clock, can be received at a clock receiver, which can be as simple as a conductive terminal or include other elements such as one of the receivers disclosed in the background or detailed description (either with or without the temperature sensor) of co-pending application Ser. No. 10/882,592, which application is incorporated herein by reference.

Also shown in FIG. 11 is control circuitry 166, which is a simplified illustration of control signals. A number of control signals, referred to generically as CONTROL, are received from a source external to the memory device 150 (e.g., from a memory controller, not shown). The control circuitry block 166 is shown as being coupled to the array, where it will provide various control signals to control operation of the device.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of adjusting the relative phases of two signals, the method comprising:
   receiving a first signal and a second signal;
   detecting a duty cycle error between the first signal and the second signal by comparing a phase component of the first signal with a phase component of the second signal, wherein detecting a duty cycle error comprises:
      delaying the first signal by a first amount to create a first delayed signal;
      delaying the second signal by the first amount to create a second delayed signal;
      comparing a phase of the first signal with a phase of the second delayed signal and providing a first output signal; and
      comparing a phase of the second signal with a phase of the first delayed signal and providing a second output signal; and
   correcting the duty cycle error by delaying the second signal by an amount of delay, the amount of delay being adjusted on the basis of a combination of the first output signal and the second output signal.

2. The method of claim 1 wherein the step of receiving a first signal and a second signal comprises receiving a differential signal and deriving the first signal and the second signal from the differential signal.

3. The method of claim 1 wherein the first signal is a complement of the second signal.

4. The method of claim 1 and further comprising adjusting the first amount of delay based upon the first output signal and the second output signal.

5. The method of claim 4 wherein the first amount of delay is adjusted until a rising edge of the first signal is aligned with a rising edge of the second delayed signal.

6. The method of claim 1 wherein the first amount of delay is adjusted by a second amount so that the rising edge of the first signal is aligned with the rising edge of the second delayed signal and wherein the step of correcting the duty cycle error comprises delaying the second signal by an amount equal to about half of the second amount.

7. The method of claim 1 wherein the first signal comprises a first clock signal and wherein the second signal comprises a second clock signal.

8. The method of claim 7 wherein the step of receiving a first signal and a second signal comprises receiving a differential clock signal and deriving the first clock signal and the second clock signal from the differential clock signal.

9. A method of operating a semiconductor device, the method comprising:
   receiving a first signal;
   receiving a second signal that is a complement of the first signal;
   delaying the first signal by a first amount of delay to obtain a delayed version of the first signal, the first amount of delay being adjusted so that an edge of the delayed version of the first signal is aligned to an edge of the second signal;
   delaying the second signal by the first amount of delay to obtain a delayed version of the second signal; and
   delaying the second signal by a second amount of delay, the second amount of delay adjusted to create a selected duty cycle between the first signal and the second signal after the second signal has been delayed by the second amount of delay,
   wherein the second amount of delay is adjusted on the basis of a combination of a first output signal and a second output signal, the first output signal being obtained by comparing a phase of the first signal with a phase of the second delayed signal and providing a first output signal, and the second output signal being obtained by comparing a phase of the second signal with a phase of the first delayed signal and providing the second output signal.

10. The method of claim 9 wherein the first amount of delay is determined from the phase of the first signal and the phase of a second signal.

11. The method of claim 10 wherein the first amount of delay is determined on the basis of a comparison of the phase of the first signal to the phase of the delayed version of the second signal.

12. The method of claim 11 wherein the first amount of delay is also determined on the basis of a comparison of the phase of the second signal to the phase of the delayed version of the first signal.

13. The method of claim 10 wherein the first amount of delay is determined on the basis of a comparison of the phase of the second signal to the phase of the delayed version of the first signal.

14. The method of claim 9 wherein the first signal and the second signal are derived from a differential clock signal, the first signal being a complement of the second signal.

15. The method of claim 14 wherein the semiconductor device comprises a double data rate synchronous dynamic random access memory, the method further comprising:
   outputting a first data bit synchronously with the first signal; and
   outputting a second data bit synchronously with the second signal.

16. The method of claim 15 wherein the step of outputting a first data bit comprises outputting the first bit of data synchronously with a rising edge of the first signal and wherein outputting a second data bit comprises outputting the second bit of data synchronously with a rising edge of the second signal.

17. A method of adjusting clock signals, the method comprising:
   receiving a differential clock;
   generating a first input clock signal and a second input clock signal from the differential clock signal;
   delaying the first input clock signal to derive a first output clock signal;
   delaying the second input clock signal to derive a second output clock signal;
   delaying the first output clock signal to derive a first delayed clock signal;
   delaying the second output clock signal to derive a second delayed clock signal;
   comparing a phase of the first output clock signal with a phase of the second delayed clock signal and providing a first output signal;
   comparing a phase of the second output clock signal with a phase of the first delayed clock signal and providing a second output signal; and
   adjusting the delay of the second input clock signal by a first amount and adjusting the delay of the first and second output clock signals by a second amount, the first amount and the second amount being set on the basis of a combination of the first output signal and the second output signal.

18. A phase adjustment circuit comprising:
a first delay element having an input and an output;
a second delay element having an input and an output;
a third delay element having an input and an output, the input of the third delay element being coupled to the output of the first delay element;
a fourth delay element having an input and an output, the input of the fourth delay element being coupled to the output of the second delay element;
a first phase detector having a first input coupled to the output of the second delay element and a second input coupled to the output of the third delay element;
a second phase detector having a first input coupled to the output of the first delay element and a second input coupled to the output of the fourth delay element; and
a finite state machine having a first input coupled to an output of the first phase detector and a second input coupled to an output of the second phase detector, the finite state machine having a first output coupled to a control input of the third delay element and also to a control input of the fourth delay element, the finite state machine also having a second output coupled to a control input of the second delay element.

19. The circuit of claim 18 wherein the first delay element comprises a fixed delay.

20. The circuit of claim 18 wherein the input of the first delay element is coupled to receive a first signal and wherein the input of the second delay element is coupled to receive a second signal, wherein the first signal is a complement of the second signal.

21. The circuit of claim 20 wherein the first signal is a clock signal and wherein the second signal is a clock signal.

22. The circuit of claim 18 wherein the first delay element comprises a fixed delay element and wherein the second, third and fourth delay elements comprise variable delay elements such that a delay of each variable delay element can be increased or decreased based upon a signal applied to the control input of the variable delay element.

23. The circuit of claim 22 wherein the finite state machine functions according to the following table:

| K1 | K2 | F1 | F2 |
|----|----|----|----|
| 0  | 0  | +  | 0  |
| 0  | 1  | 0  | −  |
| 1  | 0  | 0  | +  |
| 1  | 1  | −  | 0  | wherein K1 comprises a signal carried at the output of the first phase detector, K2 comprises a signal carried at the output of the second phase detector, F1 comprises a signal carried at the first output of the finite state machine that controls an amount of delay of the third and fourth delay elements, and wherein F2 comprises a signal carried at the second output of the finite state machine that controls an amount of delay of the second delay element.

24. The circuit of claim 23 wherein:
K1 is a "0" when a signal carried at the output of the second delay element has a lesser value than a signal carried at the output of the third delay element;
K1 is a "1" when the signal carried at the output of the second delay element has a greater value than the signal carried at the output of the third delay element;
K2 is a "0" when a signal carried at the output of the first delay element has a lesser value than a signal carried at the output of the fourth delay element;
K2 is a "1" when the signal carried at the output of the first delay element has a greater value than the signal carried at the output of the fourth delay element;
"+" indicates an instruction to increase a delay; and
"−" indicates an instruction to decrease a delay.

25. A double data rate synchronous dynamic random access memory device comprising:
an array of memory cells arranged in rows and columns, each memory cell including a pass transistor coupled in series with a storage capacitor;
a row decoder coupled to the array;
a column decoder coupled to the array;
a clock receiver coupled to receive an external differential clock signal, the external differential clock signal comprising a first component carried on a first conductor and a second component carried on a second conductor;
a first delay element having an input coupled to the first conductor;
a second delay element having an input coupled to the second conductor;
a third delay element having an input and an output, the input of the third delay element being coupled to an output of the first delay element;
a fourth delay element having an input and an output, the input of the fourth delay element being coupled to an output of the second delay element;
a first phase detector having a first input coupled to the output of the second delay element and a second input coupled to the output of the third delay element;
a second phase detector having a first input coupled to the output of the first delay element and a second input coupled to the output of the fourth delay element;
a finite state machine having a first input coupled to an output of the first phase detector and a second input coupled to an output of the second phase detector, the finite state machine having a first output coupled to a control input of the third delay element and also to a control input of the fourth delay element, the finite state machine also having a second output coupled to a control input of the second delay element; and
an output buffer with a first input coupled to the output of the first delay element and a second input coupled to the output of the second delay element.

26. The device of claim 25 wherein the first delay element comprises a fixed delay element and wherein the second, third and fourth delay elements comprise variable delay elements such that a delay of each variable delay element can be increased or decreased based upon a signal applied to the control input of the variable delay element.

27. The device of claim 26 wherein the finite state machine functions according to the following table:

| K1 | K2 | F1 | F2 |
|----|----|----|----|
| 0  | 0  | +  | 0  |
| 0  | 1  | 0  | −  |
| 1  | 0  | 0  | +  |
| 1  | 1  | −  | 0  | wherein K1 comprises a signal carried at the output of the first phase detector, K2 comprises a signal carried at the output of the second phase detector, F1 comprises a signal carried at the first output of the finite state machine, and wherein F2 comprises a signal carried at the second output of the finite state machine;

wherein K1 is a "0" when a signal carried at the output of the second delay element has a lesser value than a signal carried at the output of the third delay element;

wherein K1 is a "1" when the signal carried at the output of the second delay element has a greater value than the signal carried at the output of the third delay element;

wherein K2 is a "0" when a signal carried at the output of the first delay element has a lesser value than a signal carried at the output of the fourth delay element;

wherein K2 is a "1" when the signal carried at the output of the first delay element has a greater value than the signal carried at the output of the fourth delay element;

wherein "+" indicates an instruction to increase a delay; and wherein "−" indicates an instruction to decrease a delay.

28. The device of claim 25 wherein the array of memory cells comprises at least one billion memory cells.

* * * * *